United States Patent [19]

Dike

[11] Patent Number: 4,963,772
[45] Date of Patent: Oct. 16, 1990

[54] METASTABLE-IMMUNE FLIP-FLOP ARRANGEMENT

[75] Inventor: Charles E. Dike, Pleasant Grove, Utah

[73] Assignee: North American Philips Corp., Signetics Div., Sunnyvale, Calif.

[21] Appl. No.: 307,861

[22] Filed: Feb. 7, 1989

[51] Int. Cl.⁵ ............................................. H03K 3/27
[52] U.S. Cl. .................................. 307/480; 307/272.1; 307/443
[58] Field of Search ................. 307/480, 272.1, 269, 307/291, 443, 354–355; 328/206

[56] References Cited

U.S. PATENT DOCUMENTS

| | | | |
|---|---|---|---|
| 4,121,120 | 10/1978 | Wetterling | 307/480 |
| 4,128,201 | 12/1978 | Barron et al. | 328/206 |
| 4,282,489 | 8/1981 | DeRienzo | 235/304 |
| 4,570,082 | 2/1986 | Maley et al. | 307/480 |
| 4,580,137 | 4/1986 | Fiedler et al. | 307/480 |
| 4,786,829 | 11/1988 | Letcher | 307/480 |

Primary Examiner—Stanley D. Miller
Assistant Examiner—Terry D. Cunningham
Attorney, Agent, or Firm—T. Briody; A. Tamoshunas; R. Meetin

[57] ABSTRACT

A D-type flip-flop arrangement includes first and second latches. Circuitry interposed between the latches blocks any metastable condition that may occur in the first latch from propagating into the second latch. Additionally, the arrangement minimizes the likelihood that the first latch will enter a metastable condition and, if it does, resolves the condition extremely rapidly.

13 Claims, 4 Drawing Sheets

INPUT CIRCUIT

LATCH NO. 1

METASTABLE-IMMUNE FLIP-FLOP ARRANGEMENT

BACKGROUND OF THE INVENTION

This invention relates to digital circuitry and, more particularly, to a clocked flip-flop arrangement.

Various types of flip-flop arrangements are known in the digital signal processing art. One of these types, commonly referred to as a clocked data- (or D-) type flip-flop, includes two interconnected latches and is utilized in a number of applications of practical importance.

Such a clocked flip-flop arrangement typically includes a first latch to which input data signals and clock signals are applied. In turn, the output of the first latch is applied to a second latch that provides the output signals of the arrangement.

In operation, ambiguous signals sometimes occur at the input of the clocked flip-flop arrangement. Such signals can cause the first latch to go through a so-called metastable state. This state differs from the prescribed output digital states that the first latch is designed to provide. If such a metastable state occurs, non-prescribed signals are supplied to the second latch. In response thereto, the second latch may provide erroneous or ambiguous signals that can deleteriously affect the operation of associated circuitry connected to the output of the second latch.

Accordingly, workers in the art have directed efforts aimed at trying to resolve the aforestated metastability problem in clocked flip-flop arrangements. It was recognized that these efforts, if successful, would contribute significantly to meeting stringent modern-day demands for realizing ever more reliable and dependable digital circuitry.

SUMMARY OF THE INVENTION

In accordance with the principles of the present invention, a clocked D-type flip-flop arrangement comprising first and second latches is configured to block any signals arising from a metastable condition in the first latch from appearing at the output of the arrangement. This is done by interposing a detector between the first and second latches and by applying clock signals to the first latch via a clock latch circuit. Data signals are also applied to the first latch.

An enabling clock signal applied to the first latch via the clock latch circuit persists until the first latch has passed through any metastable condition that may occur. In turn, the detector does not propagate a signal representative of the data signal to the second latch until the first latch has passed through the metastable condition. Only after the first latch attains one of its prescribed digital representations is its output effective to cause the detector to provide a signal to the second latch. At the same time, the detector also supplies a signal to the clock latch circuit to reset it to its non-enabling state, thus preparing the arrangement for the start of another clock cycle.

Further, in accordance with this invention, the flip-flop arrangement is designed to minimize the likelihood that the first latch will enter a metastable state. Moreover, the first latch is characterized by the capability to resolve extremely rapidly any metastable state that does occur therein.

BRIEF DESCRIPTION OF THE DRAWING

A complete understanding of the present invention and of the above and other features and advantages thereof may be gained from a consideration of the following detailed description presented hereinbelow in connection with the accompanying drawing, in which.

DETAILED DESCRIPTION

Figure 1:
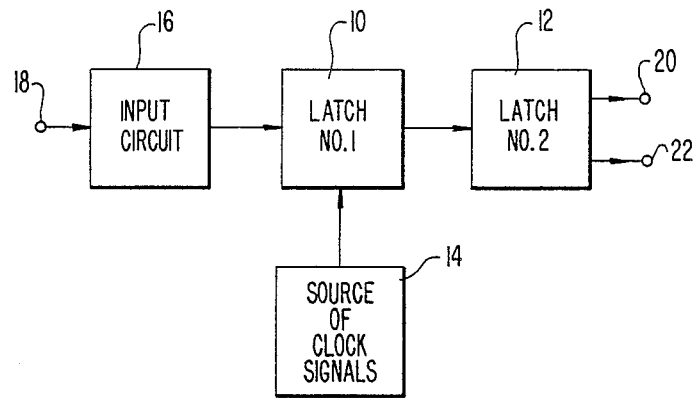
FIG. 1 is a block diagram representation of a priorly known flip-flop arrangement.

The known digital arrangement depicted in FIG. 1 is commonly referred to as a clocked D-type flip-flop. As shown, the arrangement includes two latches 10 and 12, a source 14 of clock signals, and an input circuit 16. Data signals are applied to input terminal 18, and output signals appear at terminals 20 and 22 of the arrangement.

In one mode of operation of the known FIG. 1 arrangement, asynchronous data signals appearing at the input terminal 18 are applied to the latch 10 via the input circuit 16. Clock or reference signals from the source 14 are also applied to the latch 10. Illustratively, the leading edge of each positive- (or negative-) going clock signal enables the latch 10 to respond to the data signal applied thereto by the input circuit 16. In turn, a signal representative of the state of the latch 10 is applied to the latch 12 which responds thereto by providing a differential or two-rail output signal at the terminals 20 and 22. Associated circuitry (not shown) comprising part of an overall digital system is connected to the output terminals 20 and 22.

Ideally, each of the latches 10 and 12 shown in FIG. 1 provides an output signal indicative of either one or the other of two prescribed binary representations. Proper operation of the overall system of which the depicted FIG. 1 arrangement constitutes a part depends on these output representations consistently indicating only one or the other of the two prescribed signal conditions. Any other output condition appearing at the terminals 20 and 22 can cause the system to operate in an ambiguous or erroneous manner.

In actual operation, the known FIG. 1 arrangement can experience what is commonly referred to as a metastable condition. Such a condition arises, for example, if an enabling clock signal is applied to the latch 10 by the source 14 at a time when the input data signal applied to the latch 10 is in transition between the levels representative of the two prescribed binary values respectively assigned to indicate 0 and 1 data signals.

When the latch 10 of FIG. 1 goes into a metastable condition, it provides an aberrant signal to the latch 12. This signal differs from the two prescribed binary signal values that the latch 12 is designed to receive. As a consequence, the latch 12 can itself be thus triggered into a metastable condition, thereby providing non-prescribed signal representations at the output terminals 20 and 22.

In accordance with the principles of the present invention, the aforedescribed metastable condition is effectively blocked from appearing at the output terminals of a clocked flip-flop arrangement. In further accord with the invention, the time during which metastability of such an arrangement can occur is minimized. Furthermore, the inventive arrangement is designed such that, if metastability does occur, recovery therefrom takes place extremely rapidly.

Figure 2:
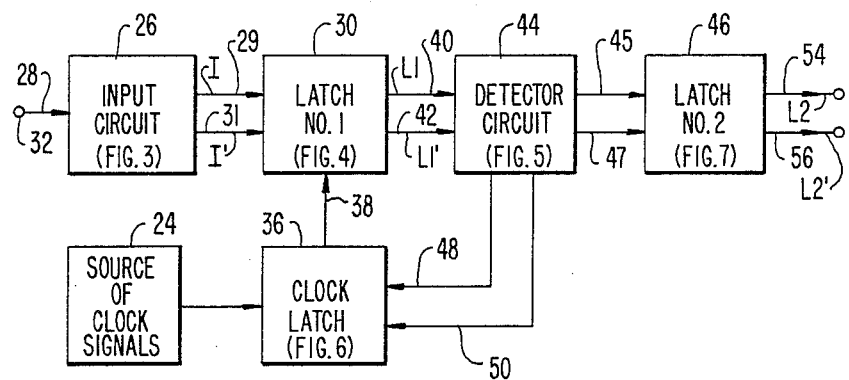
FIG. 2 is a block diagram representation of a specific illustrative flip-flop arrangement of the type depicted in FIG. 1 but modified in accordance with the principles of the present invention.

A specific illustrative flip-flop arrangement made in accordance with the principles of the present invention is shown in block diagram form in FIG. 2. Each block (except clock signal source 24) includes within it in parentheses a notation of one of FIGS. 3 through 7. FIGS. 3 through 7 constitute detailed specific illustrative circuit diagrams for the respective noted blocks.

Input circuit 26 in FIG. 2 is designed to provide an interface between input data line 28 and latch No. 1 which is designated by reference numeral 30. By way of example, binary data signals applied to input terminal 32 are of the so-called single-rail type. Such signals, which exist on a single line at either a HIGH or a LOW voltage level, are, for example, of the type provided by conventional transistor-transistor-logic (TTL) circuitry. Illustratively, a HIGH TTL signal level is greater than about +2 volts and a LOW TTL level is less than approximately +0.8 volts.

The input circuit 26 of FIG. 2 responds to the aforespecified input signal levels applied thereto by providing so-called differential (or two-rail) output signals I and I' on respective output lines 29 and 31. For one signal level (for example, a HIGH level) applied to input terminal 32, the output signal level appearing on the line 29 of the circuit 26 is, for example, HIGH and the output signal level on the line 31 is LOW. For the other input signal level (a LOW level), the output signal levels on the lines 29 and 31 are LOW and HIGH, respectively.

An important characteristic of the input circuit 26 (FIG. 2) is the manner in which its outputs I and I' change in response to a level change on input data line 28. When an input level change occurs, I goes, for example, from HIGH to LOW at the same time that I' goes from LOW to HIGH. In this way, the interval of uncertainty during which the latch 30 "sees" other than prescribed binary signal levels at its inputs is minimized. Thus, the length of time during which metastability can be triggered to occur in the latch 30 is also minimized.

Advantageously, the input circuit 26 of FIG. 2 is also designed to exhibit a relatively high input impedance. (A particular input circuit exhibiting an input impedance of about 100,000 ohms is shown in detail in FIG. 3 and will be described below.) Such an impedance imposes a relatively small load on the input data line 28.

Figure 3:
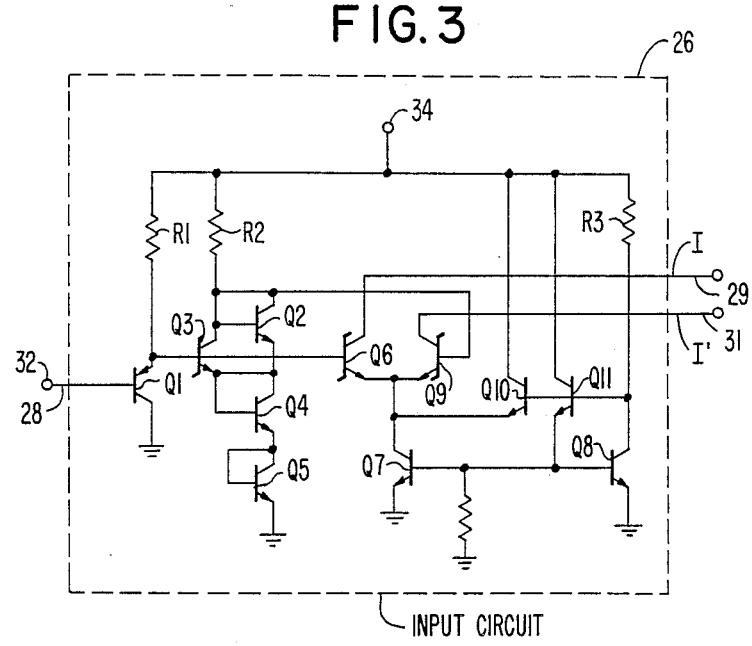
FIG. 3 shows a specific illustrative input circuit of the type that may be included in the FIG. 2 arrangement.

A particular illustrative diagram for the input circuit 26 of FIG. 2 is shown in detail in FIG. 3 within dash-line block 26. The FIG. 3 circuit includes the previously specified input data line 28, input terminal 32, and output lines 29 and 31.

Bipolar pnp input transistor Q1 shown in FIG. 3 provides the aforementioned high input impedance of the circuit 26. Bipolar npn transistor Q2, Schottky-diode-clamped bipolar npn transistor Q3, and bipolar npn transistors Q4 and Q5 connected as diodes supply a differential signal to a differential pair comprising Schottky-diode-clamped bipolar npn transistors Q6 and Q9. Bipolar npn transistors Q7 and Q8 are matched and form a current mirror, Q10 keeps the collector of Q7 from going below one base-to-emitter voltage drop, and Q11 prevents signal fluctuations from occurring on the bases of Q7 and Q8. Resistors R1, R2 and R3 are each the same value as resistors R4 and R5 shown in FIG. 4. Each of these resistors has, for example, a value of about 5,000 ohms.

Terminal 34, which is shown in FIG. 3 and also in each of FIGS. 4 through 7, is connected to a positive direct-current power supply voltage referred to herein as $V_{cc}$. In each of the circuits of FIGS. 3 through 7, this voltage has a value of about +5 volts. Further, the notations $V_{be}$, $V_{sat}$ and $V_{sch}$ will be respectively employed herein to specify a transistor base-to-emitter voltage drop (typically about 0.7 volts), a conducting (saturated) transistor collector-to-emitter voltage drop (typically about 0.3 volts) and the forward voltage drop across a Schottky diode (about 0.4 volts).

In the FIG. 3 circuit, a HIGH representation on one of the output lines I and I' is indicated by a voltage level equal to $V_{cc}$. A LOW representation on the other line is indicated by a voltage level equal to $3V_{be}-V_{sat}$.

As indicated in FIG. 2, the differential output I,I' of the circuit 26 is applied to the latch 30 via lines 29,31. Another input is supplied to the latch 30. This additional input is applied to the latch 30 from clock latch 36 via line 38.

In response to input data and clock signals, the latch 30 of FIG. 2 provides a differential output L1 and L1' on lines 40 and 42, respectively. In turn, this output is applied to detector circuit 44.

Figure 4:
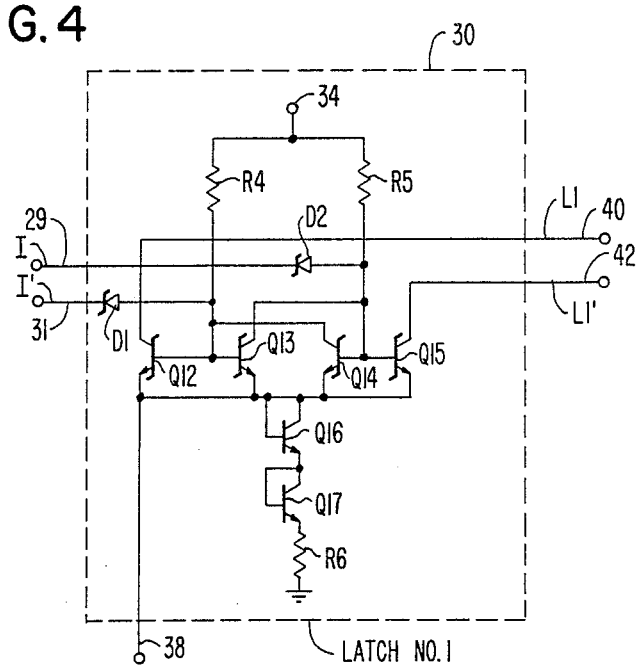
FIG. 4 depicts a specific illustrative circuit of the type that may function as latch No. 1 in the FIG. 2 arrangement.

FIG. 4 depicts within dash-line block 30 a specific illustrative circuit diagram of the latch 30. The FIG. 4 circuit shows the lines 29 and 31 emanating from the input circuit 26, the line 38 emanating from the clock latch 36 and output lines L1 and L1'.

The latch portion of the circuit 30 shown in FIG. 4 comprises Schottky-diode-clamped bipolar npn transistors Q13 and Q14. As shown, the collector of Q13 is tied directly to the base of Q14, and the collector of Q14 is tied directly to the base of Q13. This is an advantageous high-speed configuration because it provides the shortest possible latch interconnections.

Schottky-diode-clamped bipolar npn transistors Q12 and Q15 in FIG. 4 are common-emitter output devices that supply the differential outputs L1 and L1'. Schottky diodes D1 and D2 block current from flowing into the bases of Q13 and Q14 from the input circuit 26 when the clock signal applied to the line 38 is LOW. Bipolar npn transistor Q16, diode-connected bipolar npn transistor Q17 and resistor R6 function to limit the rise of the line 38 when the clock signal goes HIGH, thereby to increase the speed of operation of the depicted latch.

The FIG. 4 circuit is designed to minimize the capacitances and resistances connected to the bases of Q13 and Q14. This insures that the recovery time of the latch 30 from metastability will be relatively rapid. Additionally, it is advantageous to maximize the transconductance of the transistors Q13 and Q14. This will further speed up the recovery from metastability. One effective way of increasing the transconductance of Q13 and Q14 is to fabricate them in a standard double-base layout configuration.

In FIG. 4, the clock signal on line 38 is designed to be either HIGH (about $2V_{be}$ or more) or LOW ($V_{sat}$). When the clock signal goes LOW, the latch 30 is enabled to respond to differential data signals appearing on input lines 29 and 31. Due to the action of the clock latch 36 (FIGS. 2 and 6), the clock line 38 will remain LOW at least until the detector circuit 44 (FIGS. 2 and 5) senses that the output of the latch 30 has attained one of its prescribed binary states.

When the clock signal applied to the input line 38 of the latch 30 of FIG. 4 is HIGH, the output representations L1 and L1' on the lines 40 and 42 are $3V_{be}-V_{sch}$ and approximately $4V_{be}-V_{sch}$. These output signal representations, together with the clock line 38 being HIGH, are ineffective to cause the detector circuit 44 (FIGS. 2 and 5) to provide a switching signal to latch No. 2 (which is designated by reference numeral 46 in FIG. 2 and is shown in detail in FIG. 7). Nor, under these conditions, does the detector circuit 44 provide a reset signal to the clock latch 36.

When the clock signal applied to the input line 38 of the latch 30 of FIG. 4 goes LOW, the latch 30 may enter a metastable state. During the existence of the metastable state, the difference between the voltage levels on the output lines L1 and L1' will always be less than a threshold value $V_{be}$. In response to this lower-than-threshold difference and to the clock line being LOW, the detector circuit 44 cannot provide a switching signal to the latch 46 via lines 45 and 47. Nor can it provide a reset signal via lines 48 and 50 (FIG. 2) to the clock latch 36. As a result, the clock latch 36 continues to provide a LOW or enabling clock signal on line 38 to the latch 30 until the latch 30 resolves its metastable condition.

When the clock-enabled latch 30 of FIG. 4 comes out of its metastable state and attains one of its two prescribed output representations, the signal levels L1 and L1' on the lines 40 and 42 will be $2V_{sat}$ and $2V_{sat}+V_{be}$. At that time, due to the fact that the difference between these levels equals the threshold value $V_{be}$, and because the clock line 38 is still LOW, the detector circuit 44 provides a differential switching signal to the latch 46 and resets the clock latch 36. Significantly, these switching and reset signals are provided by the circuit 44 only after the latch 30 has unequivocally exited from any metastable state in which it may have been.

Figure 5:
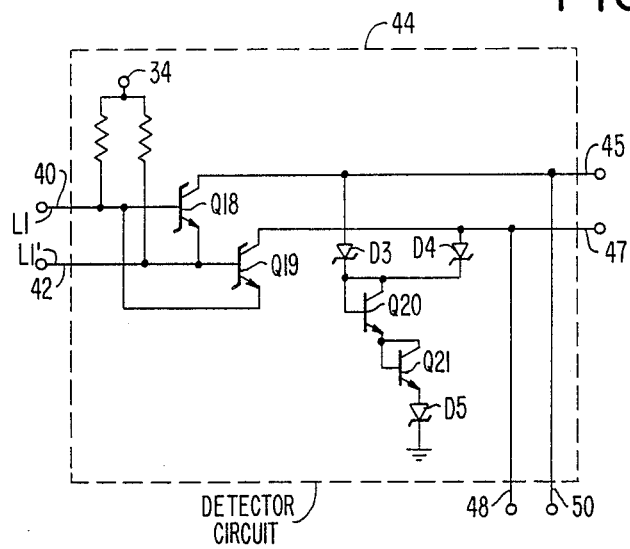
FIG. 5 is a diagram of a specific illustrative detector circuit of the type that may be included in the FIG. 2 arrangement.

The diagram of a specific asynchronous detector circuit is shown in FIG. 5 within dash-line box 44. As in FIG. 2, the input lines in FIG. 5 are designated by reference numerals 40 and 42, the output lines that apply switching signals to the latch 46 are designated 45 and 47, and the output lines that apply reset signals to the clock latch 36 are designated 48 and 50.

Schottky-diode-clamped bipolar npn transistors Q18 and Q19 in FIG. 5 comprise a difference detector similar to the detector disclosed in a commonly assigned copending application, Ser. No. 167,599, filed on Mar. 14, 1988. Schottky diodes D3 through D5 and diode-connected bipolar npn transistors Q20 and Q21 serve to clamp the high swing of the outputs of the detector circuit 44, thereby to speed up its operation.

Quiescently, that is, until the signal level on clock line 38 (FIG. 4) is LOW and the difference between the levels applied to input lines 40 and 42 of FIG. 5 reaches $V_{be}$, the differential outputs appearing on the lines 45 and 47 of the detector circuit 44 are ineffective to supply signals to the latch 46 to switch it from whichever of its set and reset states it is in. Under such quiescent conditions, the signal levels on the output lines 45 and 47 of the circuit 44 are $2V_{be}+2V_{sat}$ and $2V_{be}+2V_{sch}$. When the threshold value $V_{be}$ is reached, and assuming that the clock line 38 is LOW, the output signal levels provided by the detector circuit 44 change. Specifically, the levels on the output lines 45 and 47 go to the values $3V_{sat}$ and $2V_{be}+2V_{sat}$. The $3V_{sat}$ output signal level is effective to set or reset the latch 46 and to reset the clock latch 36. In practice, signal propagation paths in the herein-described arrangement are advantageously proportioned to cause the latch 46 to switch in response to a switching signal from the detector circuit 44 before the clock latch 36 is reset.

The detector circuit 44 of FIG. 5 thus serves to supply signals to the latch 46 only when an enabling signal appears on the clock line 38 (FIG. 4) and the output of the latch 30 has attained one of its prescribed binary states. In that way, any signal representations indicative of a metastable condition in the latch 30 are effectively blocked by the detector circuit 44 from propagating into and through the latch 46 to appear on output lines 54 and 56 (FIG. 2).

Figure 6:
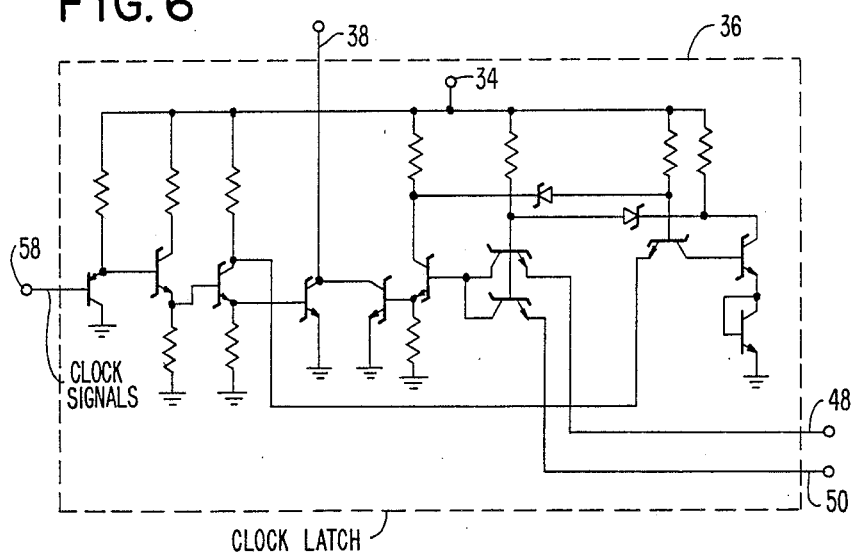
FIG. 6 shows a specific illustrative clock latch circuit of the type that may be included in the FIG. 2 arrangement.

A circuit diagram of a conventional clock latch suitable for use as the clock latch 36 of FIG. 2 is shown in detail in FIG. 6. In response to the application to input terminal 58 of FIG. 6 of a HIGH clock signal from the source 24 (FIG. 2), the clock line 38 of FIG. 6 goes LOW, thereby supplying an enabling signal to the latch 30. The line 38 will remain LOW until the clock latch is subsequently reset by one of the outputs from the detector circuit 44 going LOW (to $3V_{sat}$). The latch portion of the clock latch 36 is thus released. But if the clock signal applied to the input terminal 58 is still HIGH at the time of reset, the signal on the clock line 38 will remain LOW. But, since the latch has been released, once the input at the terminal 58 goes LOW, the clock signal on the line 38 will go HIGH and the latch 30 will no longer be enabled to respond to input data signal representations.

Figure 7:
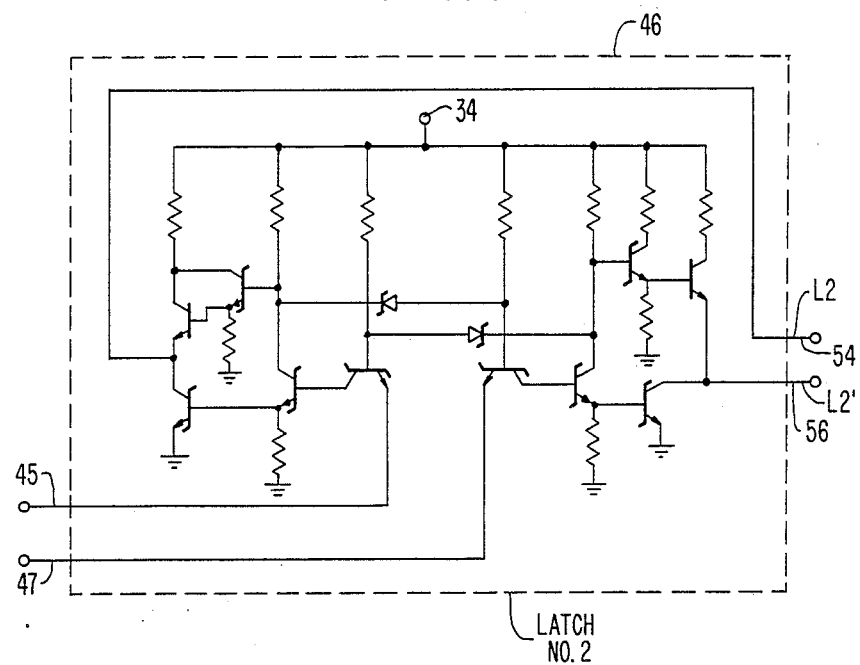
FIG. 7 depicts a specific illustrative circuit of the type that may function as latch No. 2 in the FIG. 2 arrangement.

FIG. 7 shows a specific illustrative circuit diagram of a conventional latch suitable for use as the latch 46 of FIG. 2. In FIG. 7, the lines 45 and 47 emanate from the output of the detector circuit 44. The lines 54 and 56 constitute the output of the latch 46 and, as shown in FIG. 2, also constitute the output of the overall metastable-immune flip-flop arrangement described herein.

When the input line 45 of FIG. 7 goes LOW (to $3V_{sat}$), the depicted latch 46 is switched to its set state or remains set if it is already in that state. In its set condition, the output line 54 is HIGH and the output line 56 is LOW. Similarly, a low-going signal on the input line 47 causes the latch 46 to switch to its reset state or to remain reset if it is already in that state. In its reset condition, the output line 54 is LOW and the output line 56 is HIGH.

Finally, it is to be understood that the above-described arrangements are only illustrative of the principles of the present invention. In accordance with these principles, numerous modifications and alternatives may be devised by those skilled in the art without departing from the spirit and scope of the invention.

What is claimed is:
1. A flip-flop arrangement comprising
    first and second latches, means for applying input data signals to said first latch, means settable by input clock signals for applying enabling clock signals to said first latch, and means coupled between said first and second latches and responsive to a signal from said first latch that is at least equal to a specified value for applying a switching signal to said second latch and a reset signal to said means for applying enabling clock signals.

2. An arrangement as in claim 1 wherein said means for applying input data signals comprises an input circuit for applying two-rail digital signals to said first latch.

3. An arrangement as in claim 2 wherein said means for applying input data signals comprises an input circuit responsive to single-rail digital signals for applying two-rail digital signals to said first latch.

4. An arrangement as in claim 3 wherein said input circuit exhibits a high-input-impedance characteristic.

5. An arrangement as in claim 1 wherein said means coupled between said latches comprises an asynchronous difference detector.

6. An arrangement as in claim 5 wherein signals are applied from said first latch to said difference detector in a two-rail digital representation.

7. An arrangement as in claim 6 wherein said difference detector is responsive to said signal from said first latch which consists of the difference in levels of the two-rail representation from said first latch being less than a specified value to block signals from said first latch from being applied to said second latch.

8. An arrangement as in claim 7 wherein said difference detector includes means for limiting the voltage excursion of output signals provided by said detector.

9. An arrangement as in claim 8 wherein said first latch includes means for limiting the voltage excursion of clock signals applied thereto.

10. An arrangement as in claim 1 wherein said means settable by said input clock signals includes a clock latch responsive to said input clock signals of a specified level for continuing to provide said enabling clock signals to said first latch until said clock latch is reset by said reset signal from said means coupled between said first and second latches.

11. An arrangement as in claim 10 wherein signal propagation path delays in said arrangement are proportioned to cause said second latch to switch in response to a switching signal from said means coupled between said first and second latches before said clock latch is reset.

12. An arrangement as in claim 11 further including a source for applying said input clock signals to said clock latch means.

13. An arrangement as in claim 1 in which said means settable for input clock signals applies enabling clock signals only to said first latch.

* * * * *